US010637446B1

(12) United States Patent
Mathur

(10) Patent No.: US 10,637,446 B1
(45) Date of Patent: Apr. 28, 2020

(54) DUAL VOLTAGE RANGE CMOS RECEIVER

(71) Applicant: SanDisk Technologies LLC, Addison, TX (US)

(72) Inventor: Shiv Harit Mathur, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/450,619

(22) Filed: Jun. 24, 2019

(51) Int. Cl.
*H03K 3/356* (2006.01)
*G05F 1/575* (2006.01)
*H04B 1/10* (2006.01)
*H04B 1/18* (2006.01)
*H03K 19/0185* (2006.01)

(52) U.S. Cl.
CPC ....... *H03K 3/356113* (2013.01); *G05F 1/575* (2013.01); *H03K 19/018521* (2013.01); *H04B 1/1081* (2013.01); *H04B 1/18* (2013.01)

(58) Field of Classification Search
None
See application file for complete search history.

(56) References Cited

U.S. PATENT DOCUMENTS

| | | |
|---|---|---|
| 5,933,459 A | 8/1999 | Saunders et al. |
| 6,600,338 B1 | 7/2003 | Nguyen et al. |
| 6,838,924 B1 | 1/2005 | Davies, Jr. |
| 6,970,024 B1 * | 11/2005 | Reese .............. H03K 3/356113 327/112 |
| 8,421,501 B1 | 4/2013 | Rien et al. |
| 8,723,584 B2 | 5/2014 | Larsen et al. |
| 8,994,412 B2 * | 3/2015 | Kim .................. H03K 3/356165 327/109 |
| 9,467,125 B2 | 10/2016 | Kumar et al. |
| 9,806,700 B2 | 10/2017 | Iguelmamene |
| 9,948,283 B2 * | 4/2018 | Takayanagi ...... H03K 3/356113 |
| 2005/0104641 A1 | 5/2005 | Chen et al. |
| 2006/0045206 A1 | 3/2006 | Keeth et al. |
| 2006/0203938 A1 | 9/2006 | Keeth et al. |
| 2007/0024331 A1 | 2/2007 | Lin |
| 2008/0266276 A1 | 10/2008 | Choi et al. |
| 2009/0273373 A1 | 11/2009 | Do |
| 2010/0019852 A1 | 1/2010 | Leitner |
| 2010/0207663 A1 | 8/2010 | Do |
| 2010/0321100 A1 * | 12/2010 | Guo ..................... H03K 17/162 327/537 |

OTHER PUBLICATIONS

Shih-Lun Chen and Ming-Dou Ker, *A New Schmitt Trigger Circuit in a 0.13 μm 1/25/V CMOS Process to Receive 3.3 V Input Signals*, Nanoelectronics and Gigascale Systems Laboratory Institute of Electronics, National Chiao-Tung University, Taiwan, ISCAS 2004.

* cited by examiner

*Primary Examiner* — Jeffery S Zweizig
(74) *Attorney, Agent, or Firm* — Rowan TELS LLC

(57) ABSTRACT

An input signal is split onto a first data path and a second data path. Values of the input signal above a threshold voltage level are propagated on the second data path and not on the first data path. The propagation of the signal from the input signal terminal through the first data path or the second data path is selectively controlled using two reference bias voltages generated based on a level of the signal.

20 Claims, 10 Drawing Sheets

DUAL VOLTAGE RANGE CMOS RECEIVER

BACKGROUND

The trend with electronic devices is toward smaller sizes and higher speeds. As such devices decrease in size their ability to tolerate higher voltage decreases. For example devices fabricated at scales of 28 nm (nanometers) and below may utilize a ~35 A (angstrom) oxide thickness and cannot sustain operational voltage stress beyond about 2.0V (volts). Operational voltage stress is stress on the structure and function of a circuit due to voltage levels that exceed the circuit's physical capabilities. Many electronic devices fabricated at lower scales are required to handle voltages higher than 2.0V, i.e. 3.3V, either to remain backward compatible with older devices, or for broad market applicability.

A digital receiver circuit stage is often utilized in electronic devices. This stage performs two functions: (a) to provide noise immunity, and (b) to digitize an analog signal applied on an input signal terminal of the electronic device. A CMOS-technology receiver circuit has an advantageous power, performance, and area characteristics compared to many alternatives. A high speed CMOS receiver circuit fabricated at 28 nm or lower scales may be required to support 3.3V and 1.8V signal voltage levels while retaining power and area efficiency.

One way to enable electronic devices to support higher voltages, i.e. 3.3V, is to utilize electrical components, especially transistors, fabricated with ~50 A oxide thicknesses. However, this may lead to overall performance loss and a larger circuit on-die area.

FIG. 1 illustrates a conventional receiver circuit 100. The conventional receiver circuit 100 comprises a clamp transistor 102, a Schmitt trigger circuit 104, and a level shifter 106. The conventional receiver circuit 100 is familiar in the art. At a high level, the clamp transistor 102 limits the voltage level of signals applied to later stages of the circuit to safe (non-damaging) values. The Schmitt trigger circuit 104 digitizes the limited analog voltage passed from the clamp transistor 102. The level shifter 106 shifts the output of the Schmitt trigger circuit 104 to logic values (logical "1"s and "0" s) suitable for processing in later stages.

All circuit components of the conventional receiver circuit 100 are 35 A thick oxide devices that can support 1.8V operation (e.g., a low range operational mode) within a tolerance (e.g., +/−10%), for example. The clamp transistor 102 clamps the voltage at input signal terminal (which for example may range from 0-3.3V) to 1.8V to protect the circuitry in later stages from operational voltage stress. The signal passing the clamp transistor 102 is digitized—converted from analog to digital format—by the Schmitt trigger circuit 104. The clamp transistor 102, being an NMOS transistor, clamps the input signal terminal voltage to 1.8V−Vt, where Vt is the threshold voltage drop across MN5. This in turn requires the Schmitt trigger circuit 104 thresholds to be configured at lower values, compromising noise immunity. The input signal voltage level subsequent to MN5 does not have the full voltage range VSSO-VDD18 (the full "rail-to-rail" range) and thus the PMOS transistor device MP1 never turns off (a characteristic of Schmitt trigger circuits of this type). This in turn incurs substantial standby current in the Schmitt trigger circuit 104. Due in part to it's lowered noise immunity, the conventional receiver circuit 100 may not perform well at frequencies beyond a few 10's of megahertz.

To mitigate these problems, the clamp transistor 102 may be replaced by a native NMOS transistor device. A native NMOS transistor is a variety of transistor that is doped such that it's electrical properties are intermediate between enhancement and depletion modes. A native transistor has nearly zero threshold voltage. However, native transistors are up to 2-3 times longer and wider in size than a standard transistor with a threshold voltage drop. Therefore the option of using a native transistor for the clamp transistor 102 may not be practical at smaller fabrication scales.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

This disclosure relates to a multi-power domain signal receiver circuit able to quickly select between multiple data paths for different input signal voltage ranges. Herein the term 'range' when used alone refers to values between a lower and upper limit. By contrast, herein 'voltage range' refers to the difference between a lowest voltage level that may be expected to occur in the signal, and the highest expected voltage level. The term 'voltage range' is therefore used differently than 'range' alone. For example, a signal that varies between a low voltage of 1.0V to a high voltage of 3.0V has a range of 1.0V-3.0V, but has a voltage range of 2.0V. A signal may be divided into upper and lower ranges. For example, a signal with a range of 1.0V-3.0V may be split into a lower range of 1.0V-2.0V and an upper range of 2.0V-3.0V. Both the upper range and the lower range have a voltage range of 1.0V.

In the following description a high nominal range of 0-3.3V and a low nominal range of 0-1.8V are assumed for the input signal. However, it should be understood that these are only examples and other high and low ranges may also be implemented in other embodiments. When the input signal voltage level is in the high nominal range, the circuit is described as operating in the "high range operational mode". Likewise, when the input signal voltage level is in the lower nominal range, the circuit is described as operating in the "low range operational mode".

The receiver circuit embodiments disclosed herein may protect sensitive circuitry while maintaining a high switching speed, allowing for rapid operation. This is accomplished by generating a pair of reference bias voltages (referred to herein as VP and VN) that control the propagation of the input signal (referred to herein as IN) through either an upper range data path or a lower range data path, depending on the upper voltage of the range of the input signal. A reference bias voltage is a voltage applied to affect the channel conductivity of a transistor device, and additionally in some cases to protect against reliability failure due to electrical overstress. A reference bias voltage may be applied to a gate terminal of the transistor, or to a source or drain terminal of a transistor.

Additional logic may be implemented to digitize and filter noise from the input signal, such that the data output of the receiver circuit may be a clean, high-speed, digital version of the input signal, regulated to a voltage range low enough to prevent damage to sensitive internal components of a device, regardless of the voltage levels of the input signal.

Figure 1:
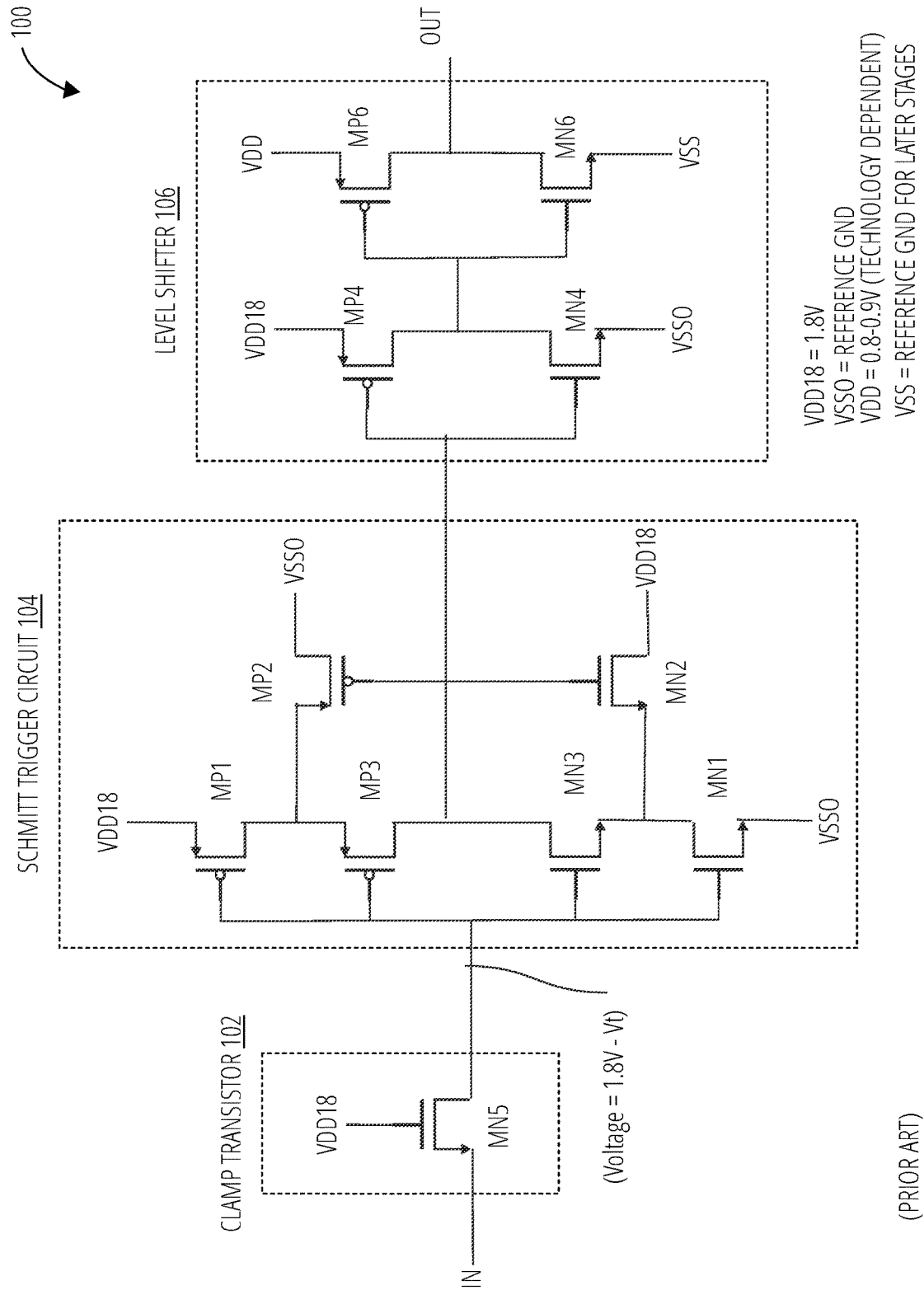
FIG. 1 illustrates a conventional receiver circuit 100 in accordance with one embodiment.
Figure 2:
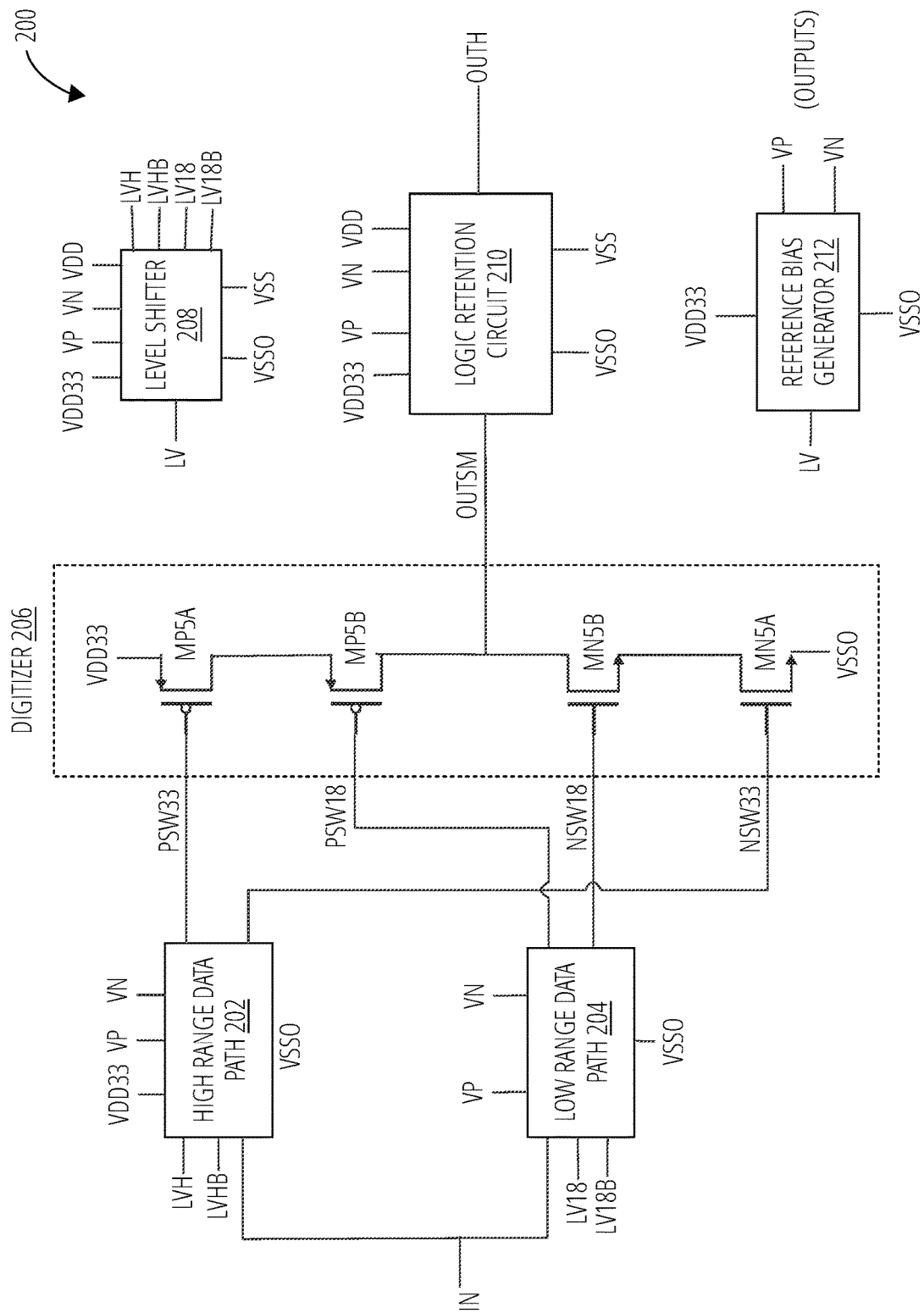
FIG. 2 illustrates a dual voltage range receiver circuit 200 in accordance with one embodiment.

FIG. 2 illustrates a dual voltage range receiver circuit 200 in one embodiment. The circuit depicted may for example operate on input signals with either a nominal range of 0.0-3.3V (a "high" voltage range of 3.3V) or a nominal range of 0-1.8V (a "low" voltage range of 1.8V). The circuit propagates the input signal through either a high range data path 202 and a low range data path 204. The circuit further includes a digitizer 206 and a logic retention circuit 210. Various signals utilized during operation are generated by a level shifter 208 and a reference bias voltage generator 212. The dual voltage range receiver circuit 200 may be constructed using only ~35 A oxide devices, because the voltage range of the signal propagated through either data path is limited to a safe value, for example to 2.0V. In general the dual voltage range receiver circuit 200 may be constructed exclusively from components rated for a particular voltage range lower than the voltage range of the signals it may receive and propagate from its input terminal to its output terminal.

Figure 5:
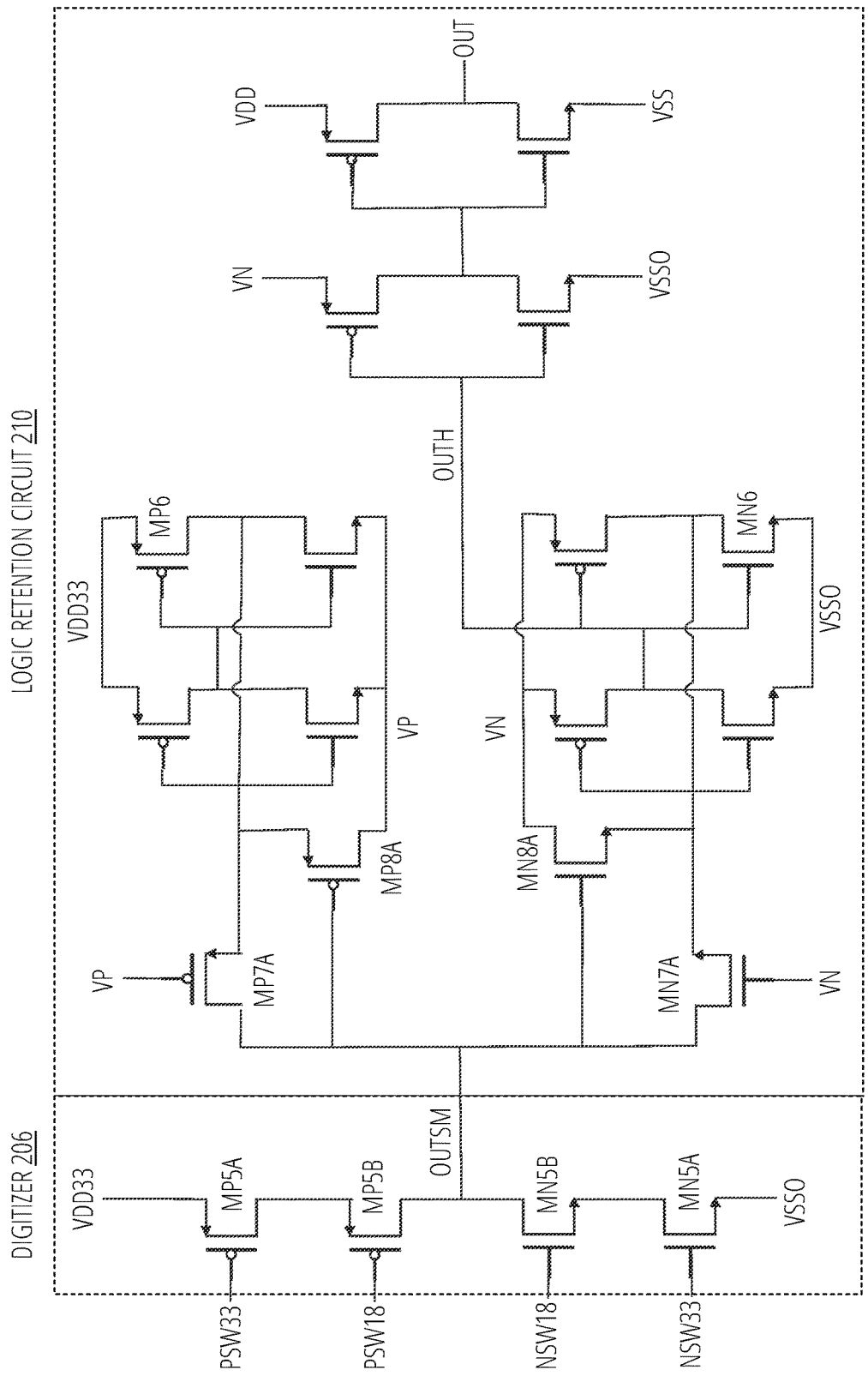
FIG. 5 illustrates a logic retention circuit 210 in accordance with one embodiment.
Figure 6:
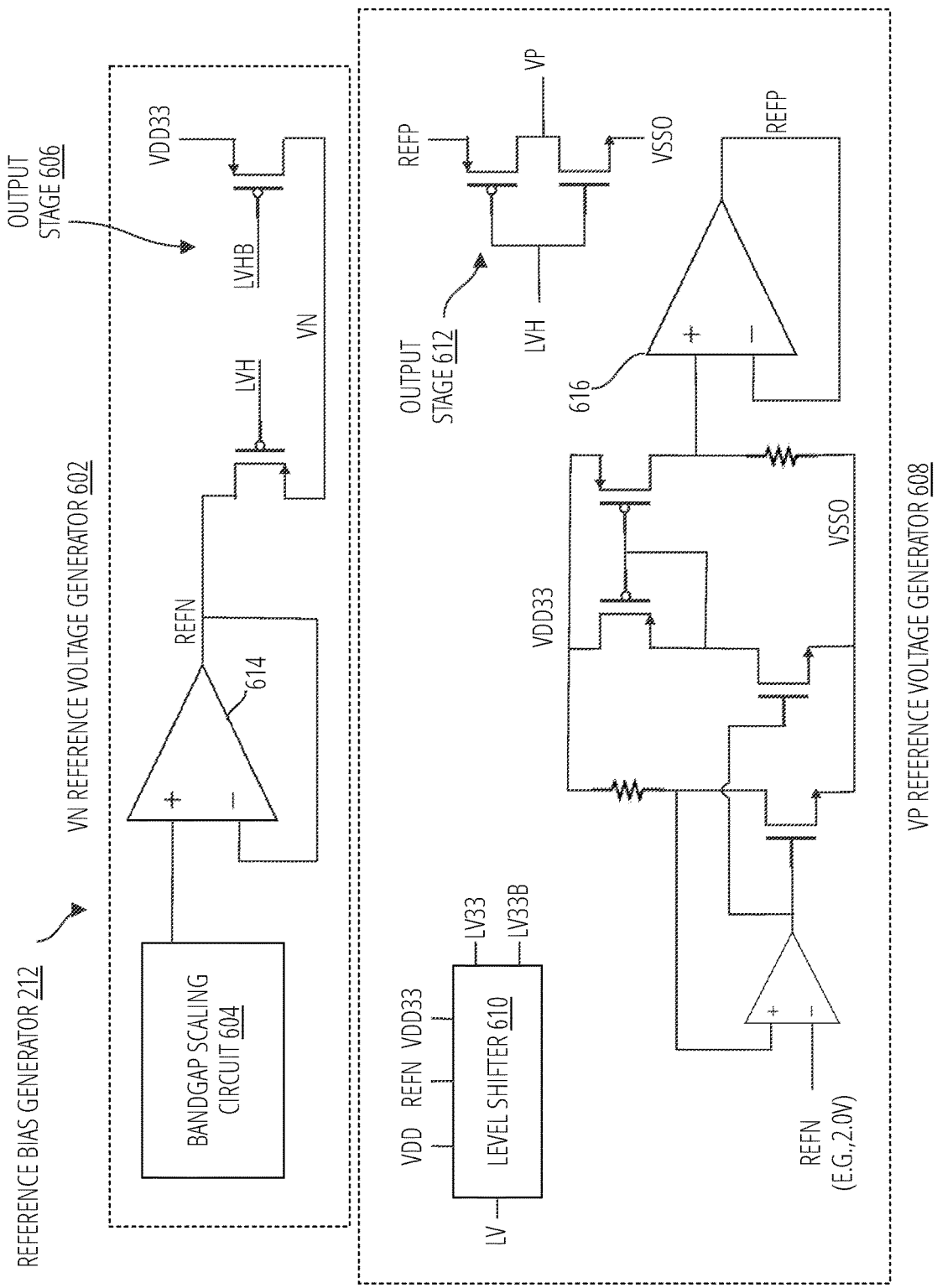
FIG. 6 illustrates a reference bias voltage generator 212 in accordance with one embodiment.

Details of one embodiment of the logic retention circuit 210 are illustrated in FIG. 5, and details of an embodiment of the reference bias voltage generator 212 are illustrated in FIG. 6. Details of the level shifter 208 will be readily understood by those of ordinary skill in the art and will not be elaborated.

Figure 3:
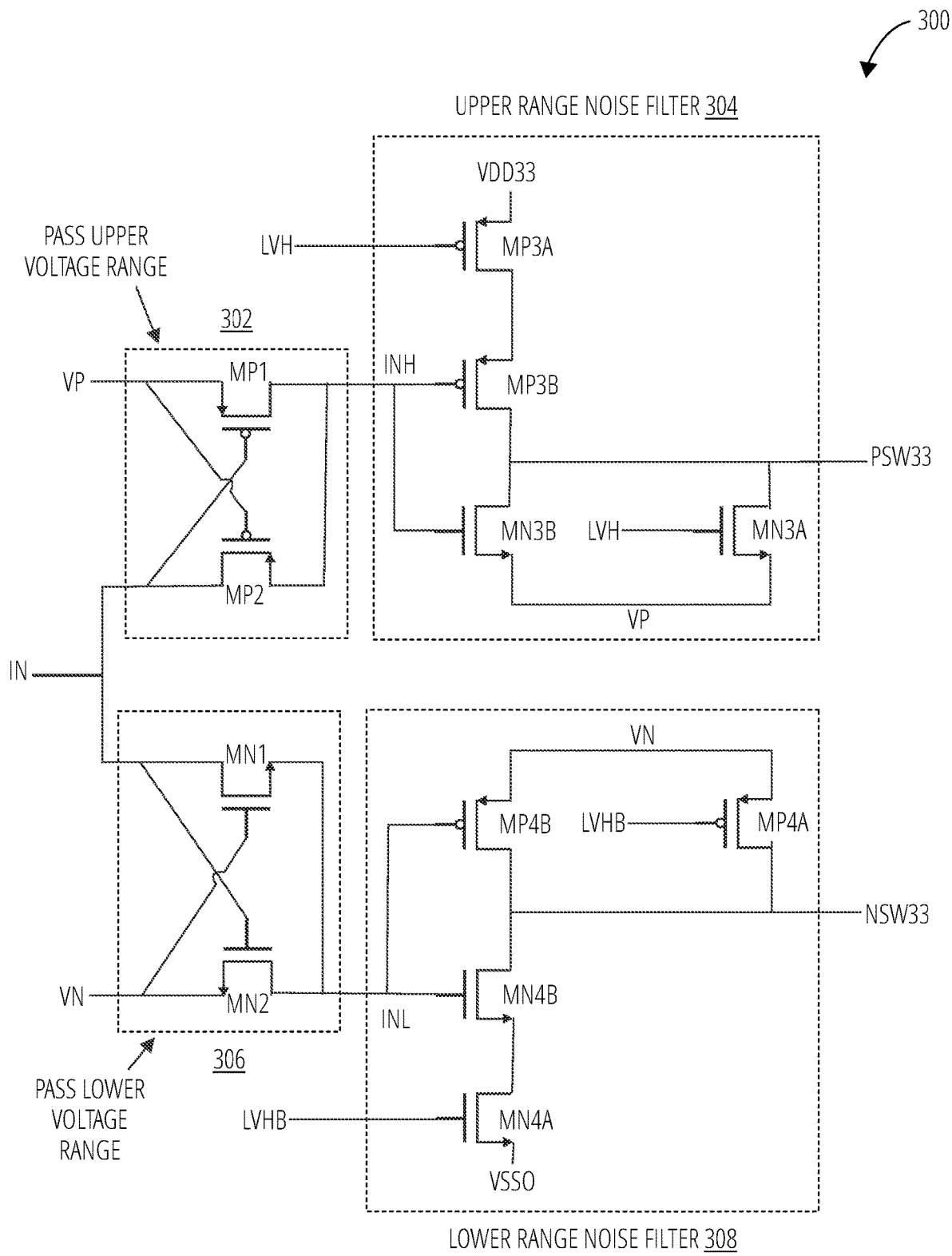
FIG. 3 illustrates a high range data path 300 in accordance with one embodiment.

FIG. 3 depicts a high range data path 300 in one embodiment. The depicted circuit routes the input signal IN to an upper range pass circuit 302 and a lower range pass circuit 306. The upper range pass circuit 302 passes an upper range INH of the input signal, which has a range of VP-VDD33. The lower range pass circuit 306 passes a lower range INL of the input signal, which has a range 0-VN. From there, the signal propagates to an upper range noise filter 304 and a lower range noise filter 308, respectively, which generate outputs PSW33 and NSW33 to the digitizer 206.

Figure 4:
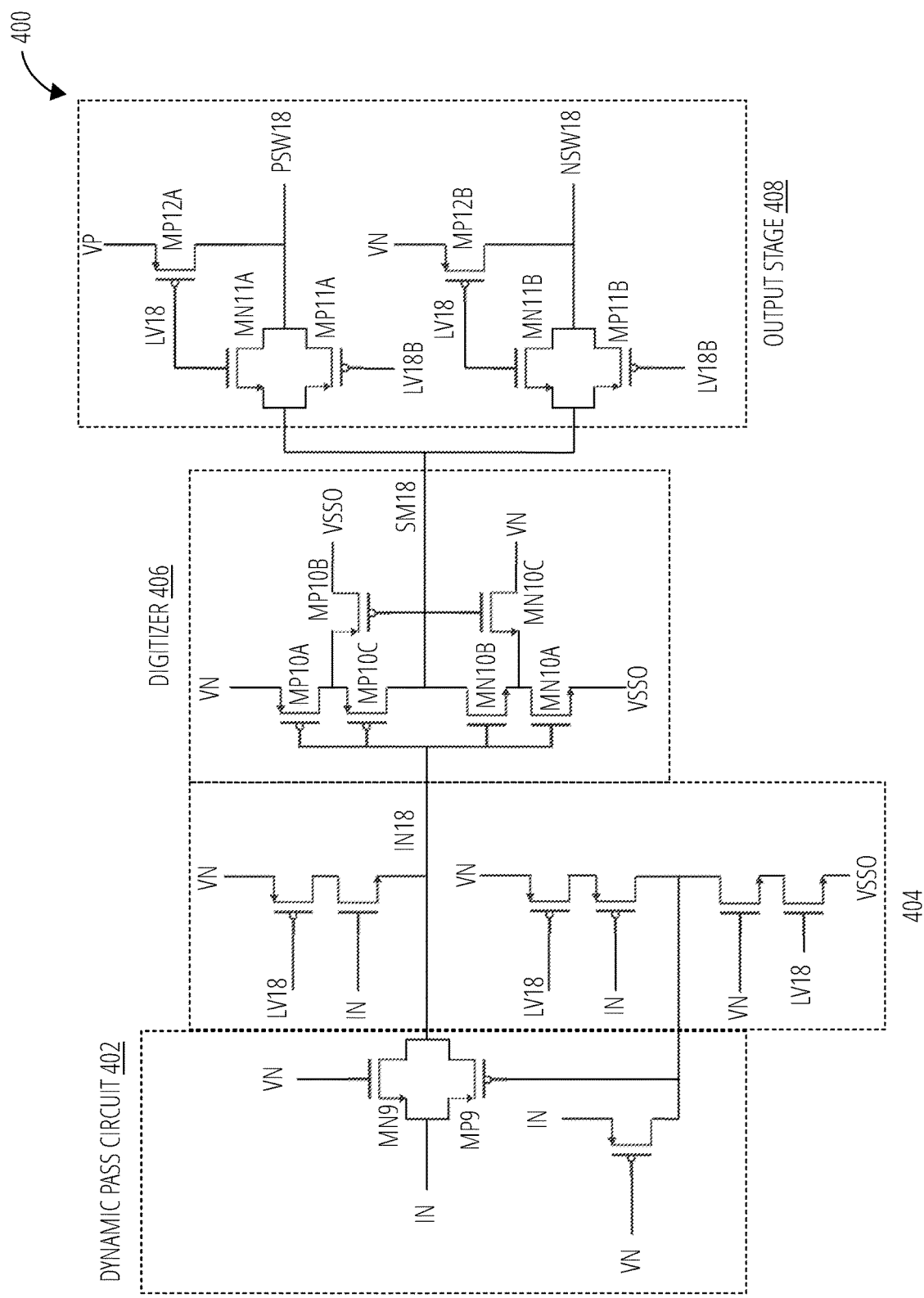
FIG. 4 illustrates a low range data path 400 in accordance with one embodiment.

FIG. 4 depicts a low range data path 400 in one embodiment, for example for implementing the low range data path 204 when the lower range is nominal 0-1.8V. The depicted circuit comprises dynamic pass circuit 402, a limiter and control circuit 404, a digitizer 406, and an output stage 408. At a high level, the input signal IN is passed to the limiter and control circuit 404 as determined by the reference bias voltage VN.

In the limiter and control circuit 404, the upper two transistors act a voltage clamp when LV18=0 e.g., when IN has a 3.3V voltage range. The lower circuit of the limiter and control circuit 404 acts as a dynamic control for dynamic pass circuit 402. Overall the dynamic pass circuit 402 and the limiter and control circuit 404 cooperate to maintain the maximum voltage experienced by the digitizer 406 and output stage 408 circuit elements to IN18=2.0V.

The output IN18 of the limiter and control circuit 404 is digitized by the digitizer 406 to produce signal SM18, which is transformed by the output stage 408 into signals PSW18 and NSW18, which are additional controls of the digitizer 206 in FIG. 2.

The operation of an exemplary embodiment will now be described in more detail in conjunction with FIG. 2 through FIG. 6. To determine how the input signal may need to be routed through the dual voltage range receiver circuit 200, a level indicator signal (LV) may be either detected from a host controller, or be generated internally using, for example, a system-on-a-chip component. The level indicator LV indicates whether the input signal IN spans a high range or a low range of voltage values, and may for example be determined in manners known in the art, for example by measuring or detecting a voltage level of IN above a configured maximum threshold voltage (e.g., using an operational amplifier as a comparator), or from metadata associated with a particular communication protocol used to communicate the input signal IN. There are various manners of ascertaining LV known in the art that will not be elaborated on here.

For signaling in the high range operational mode, LV may be a logical "0". For signaling in the low range operational mode, LV may be a logical "1". The power supply value VDD33, at nominal 3.3V voltage range, may vary for example from 2.7V to 3.6V. VDD33 at the nominal 1.8V voltage range may vary for example from 1.6V to 1.9V.

To constrain the operational voltage stress and to implement the circuit using all 35 A oxide devices, two internal reference voltages are generated, labeled herein as VP and VN. FIG. 6 illustrates details of one embodiment of a reference bias voltage generator 212 to generate the reference voltages VP and VN. The reference bias voltage generator 212 includes a VN reference voltage generator 602 for generating reference bias voltage VN, and a VP reference voltage generator 608 for generating the reference bias voltage VP. The VN reference voltage generator 602 comprises a bandgap scaling circuit 604 and an output stage 606, and the VP reference voltage generator 608 comprises a level shifter 610 and an output stage 612.

The VN reference voltage generator 602 utilizes the bandgap scaling circuit 604 to generate a reference voltage of REFN (e.g., 2.0V for a 3.3V voltage range input signal) and the voltage follower 614 (e.g., unity gain operational amplifier) provides REFN with drive current in the output stage 606. When LV=1 (low range operational mode), then VN=REFN, and when LV=0 (high range operational mode), then VN=VDD33.

The VP reference voltage generator 608 generates a voltage reference of REFP=VDD33-REFN using a voltage follower 616. When LV=1 (e.g., low range operational mode), then VP=0, and when LV=0 (high range operational mode), then VP=REFP.

The LV signal is applied to the level shifter 208 as shown in FIG. 2 and determines the mode of operation. When VDD33=3.3V, LV=0, and when VDD33=1.8V, LV=1. The circuit's mode of operation may determine the inputs to the MP5A, MP5B, MN5A, and MN5B transistors of the digitizer 206. When LV=0 (high range operational mode), the PSW33 and NSW33 signals determine the output OUTSM of the digitizer 206. When LV=1 (low range operational mode), PSW18 and NSW18 determine OUTSM. This independent control of the high range data path 202 the low range data path 204 may allow for higher speed and optimized area of the dual voltage range receiver circuit 200.

The LV signal may be sent to a bias voltage generator where the power input signal (e.g., VDD33 in the drawings) may be used to generate the reference voltages VP and VN. By way of example, for 3.3V operation (LV="0"), VN may be generated at 2.0V, and VP=VDD33−VN, which may give a VP of 1.3V. For 1.8V operation (LV="1"), VN may be set to VDD33, or 1.8V, and VP may be set to 0V. An embodiment of a bias voltage generator to accomplish this is depicted in more detail in FIG. 6.

In one example, the LV signal may range over 0-0.8V, and may need to be shifted to a higher voltage for use in the high and low voltage data path, noise filtering, and digitizing logic. LV may be applied for this purpose to a level shifter to generate signals LVH and LVHB for use in the high range data path 202, and signals LV18 and LV18B for use in the low range data path 204. The two signals for each mode may be needed to supply adequate current for all of the circuitry involved.

The LV level indicator signal(s) and the reference voltages may be used to enable the propagation of the input signal (e.g., IN in the drawings) from the input signal terminal through either the high range data path 202 or the low range data path 204. Embodiments of these data paths are shown in more detail in FIG. 3 and FIG. 4, respectively. The output signals from the data paths may be sent to the digitizer 206 to generate a digitized, high-speed, low-noise signal (e.g., OUTSM in the drawings), as shown in FIG. 2. OUTSM may be fed into a logic retention circuit 210 (which may also provide level shifting) to generate the final output signal (e.g., OUTH) of the receiver. An embodiment of a logic retention circuit 210 is shown in more detail in FIG. 5 and described further below.

FIG. 3 illustrates a high range data path 300 (e.g., high range data path 202) in one embodiment. In this embodiment the various signals utilized may be as follows: LV=0, VN=2.0V, VP=VDD33−VP, PSW18=VP, and NSW18=VN. The signal at the input signal terminal can have a range, for example, of 0.0V-3.3V and is split (applied to separate data paths) by the upper range pass circuit 302 and the lower range pass circuit 306 into two parts, INH and INL. Signal INH has the range VP-VDD33 and signal INL has the range 0-VN. The voltage levels of VP and VN are maintained such that no downstream component is exposed to higher than 2.0V, thus protecting the devices from operational voltage stress. In other words, INH and INL are both constrained to a voltage range of no more than 2.0V.

The inverter device implemented by transistors MP3B and MN4B toggles (switches between two possibilities) its binary output state when the voltage level of signal IN is greater than the reference voltage VP, while the inverter device implemented by MP4B and MN4B toggles its binary output state when IN is less than VN. This results in different switching thresholds during the rising and falling of the voltage at the input signal terminal.

Referring now to the logic retention circuit 210 embodiment illustrated in FIG. 5, as the voltage at the input signal terminal rises from 0-3.3V, initially NSW33=1, PSW33=1, and OUTSM=0. The devices MNSA, MNSB, MN7A, and MN6 are turned "ON", while other devices driving OUTSM are turned "OFF". While signal IN at the input signal terminal is less than reference voltage VN, the signal INL follows IN. When the inverter device MP4B/MN4B threshold voltage is crossed, NSW33=0 but OUTSM remains at 0 due to the intentionally-designed weakness of device MN6.

When IN exceeds VP, INL=VN and INH follows IN. When the threshold voltage of inverter device MP3B/MN3B is crossed, PSW33=0, turning "ON" MP5A and MP5B and driving OUTSM=1 by overriding the weak device MN6.

When OUTSM=1 the devices MP7A and MP6 switch "ON" and the higher-voltage circuit components are driven by the threshold voltage of inverter device MP3B/MN3B.

When the voltage at the input signal terminal (IN) falls from 3.3-0V, initially NSW33=0, PSW33=0, and OUTSM=1. The devices MP5A, MP5B, MP7A, and MP6 are turned "ON", while other devices driving OUTSM are turned "OFF". Until IN exceeds VP, INH follows the signal at the input signal terminal. When the threshold voltage of the inverter device formed by MP3B and MN3B is crossed, PSW33=1 and OUTSM=1 because MP6 is weak by design. Here "weak" refers to a device with drive impedance much higher (e.g., ~20×-30× higher) than MP5A, MP5B, MN5A, and MN5B.

While IN is less than VN, INH=VP and INL follows the voltage at input signal terminal. When the threshold voltage of the inverter device implemented by MP4B and MN4B is crossed, NSW33=1, turning "ON" MN5A and MN5B and driving OUTSM=0 by overriding the weak device MP6.

Once OUTSM=0 the devices MN7A and MN6 turn "ON" and the circuit components are driven by the threshold voltage of the inverter device MP4B/M43B.

The low range data path 204 through the dual voltage range receiver circuit 200 is made operational voltage stress free by switching the gate terminal of transistor MP9 to limit the IN18 signal to a range of 0 to VN. In addition signals PSW18 and NSW18 are set to VP and VN respectively to maintain devices MP5A, MP5B, MN5A, and MN5B operational voltage stress free.

In the low range operational mode, LV=1, VN=VDD33, VP=0, PSW33=0 and NSW33=1, effectively disabling the high range data path 202. IN18 follows the voltage on the input signal terminal through its full range. A conventional Schmitt trigger circuit is utilized over a range of VN-0V to digitize the analog signal on the input signal terminal. The rising and falling thresholds of the Schmitt trigger circuit are determined by devices MP10B and MN10B respectively.

Figure 7:
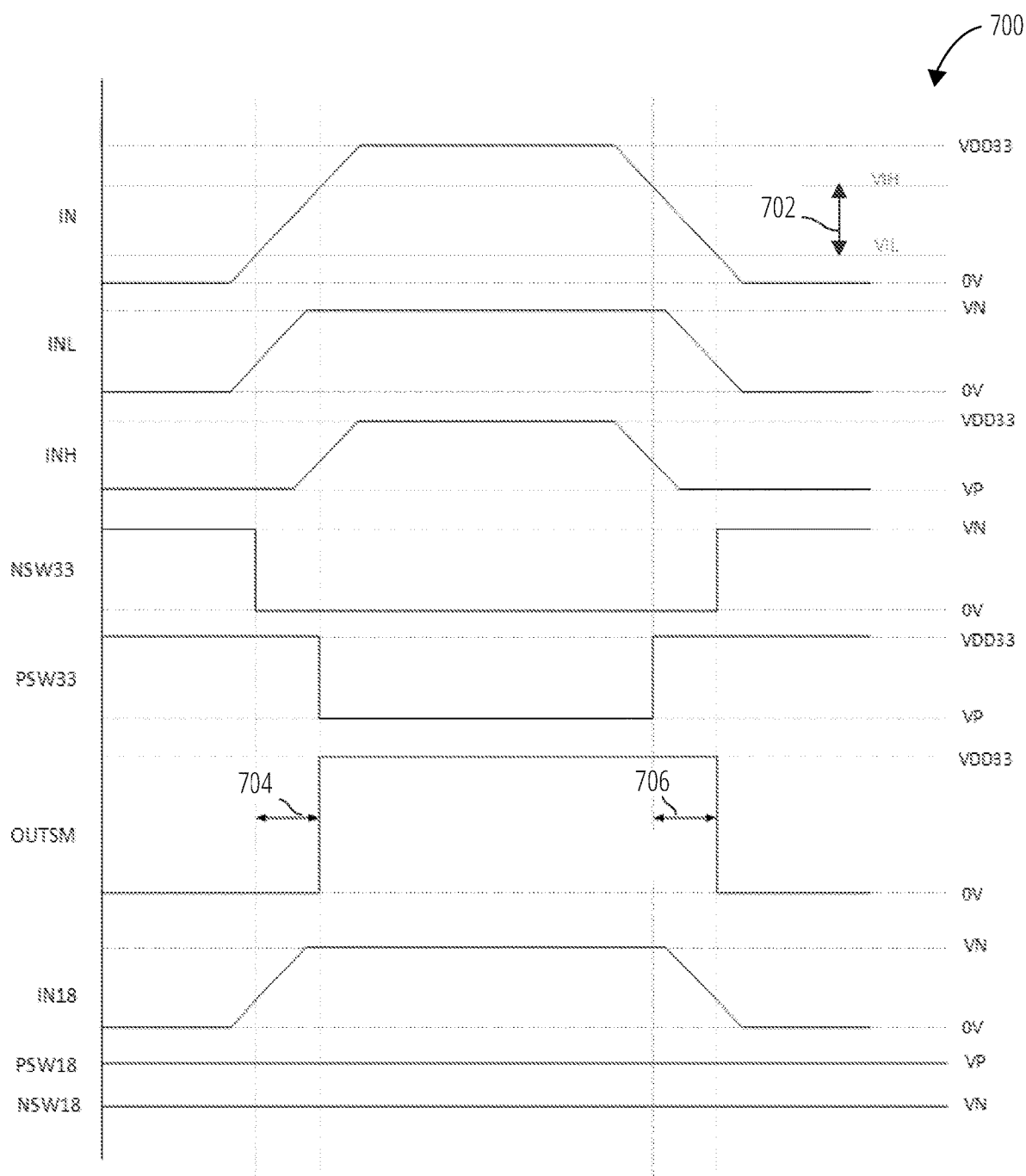
FIG. 7 illustrates a signaling 700 in accordance with one embodiment.
Figure 8:
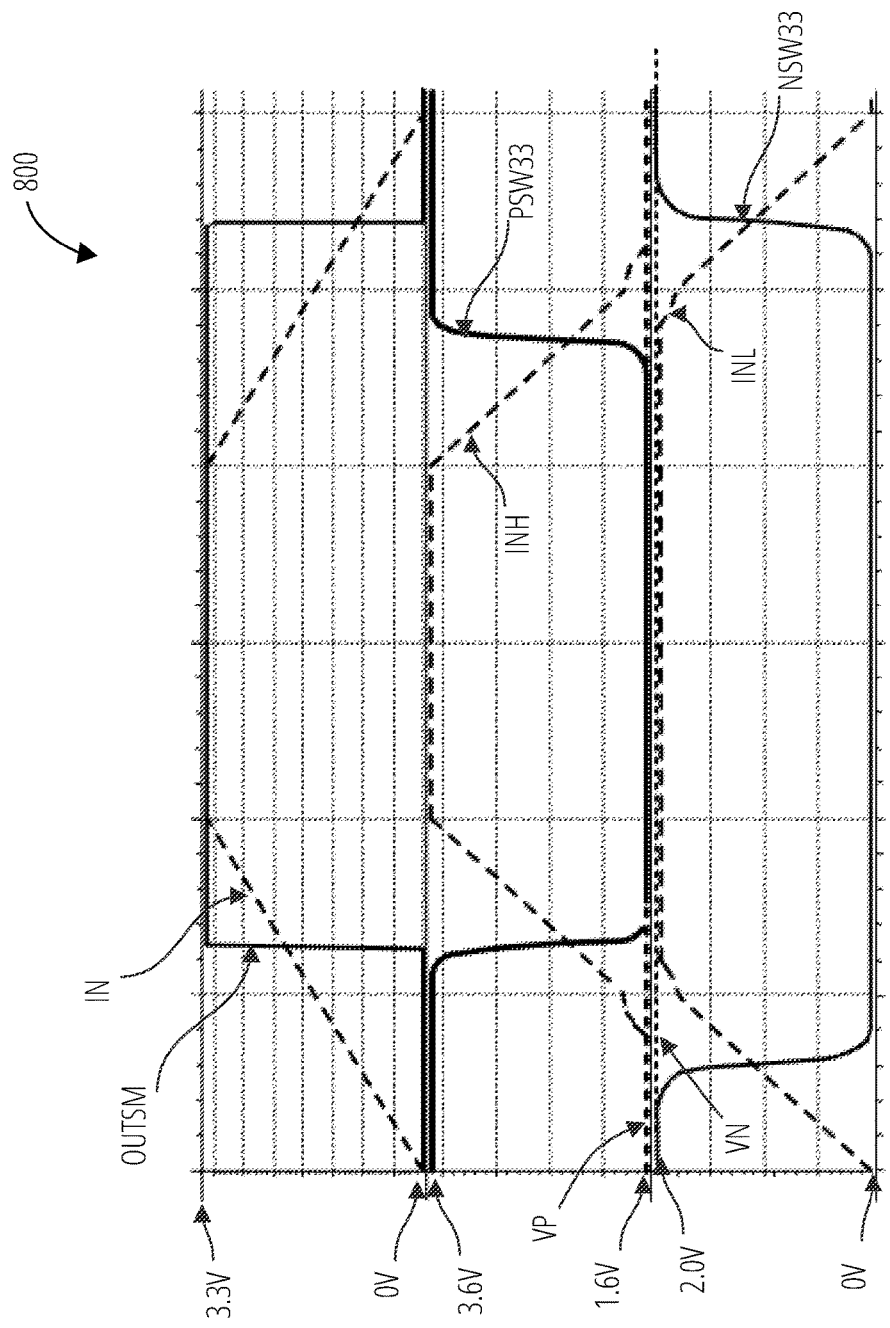
FIG. 8 illustrates a signaling 800 in accordance with one embodiment.
Figure 9:
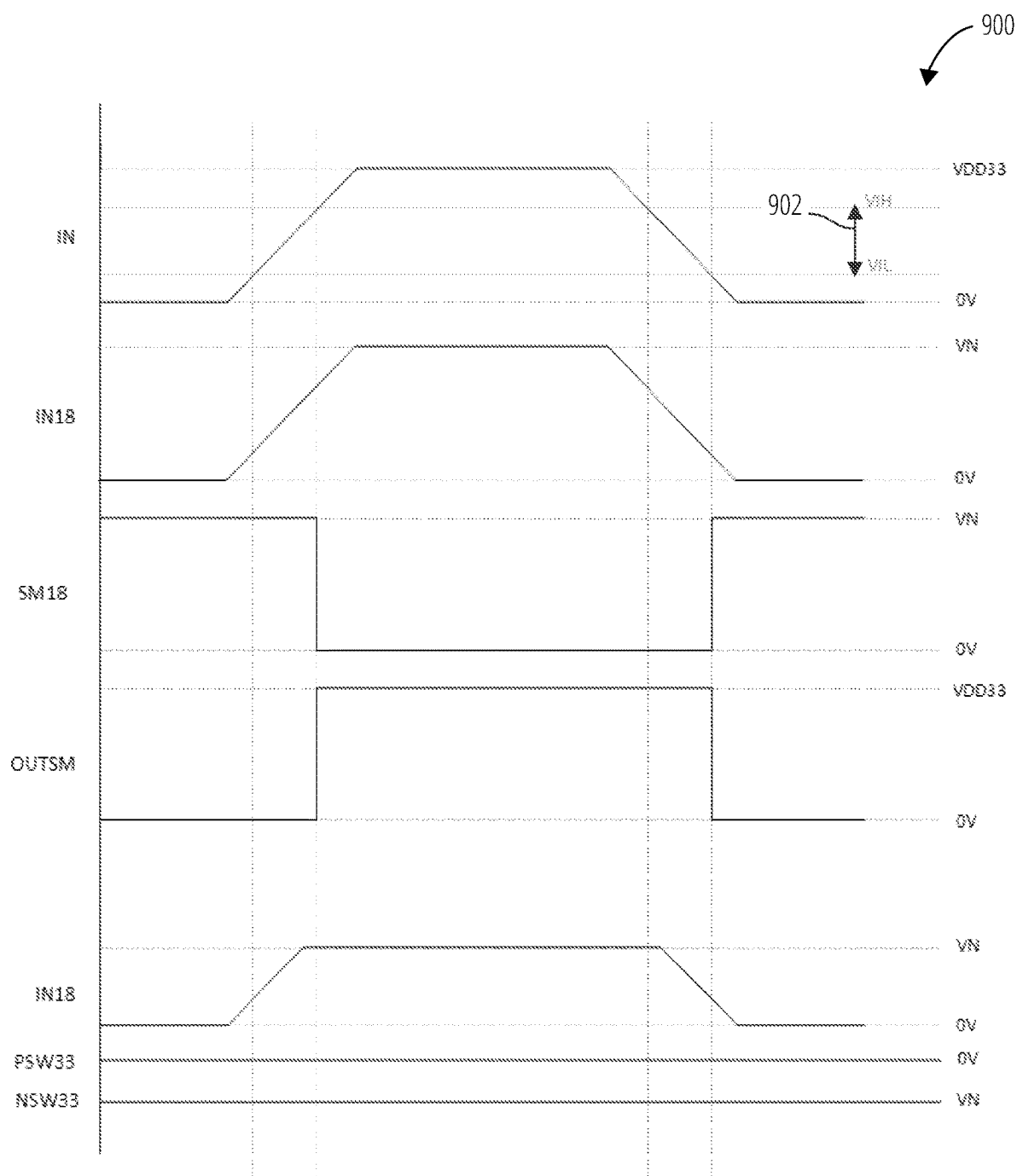
FIG. 9 illustrates a signaling 900 in accordance with one embodiment.
Figure 10:
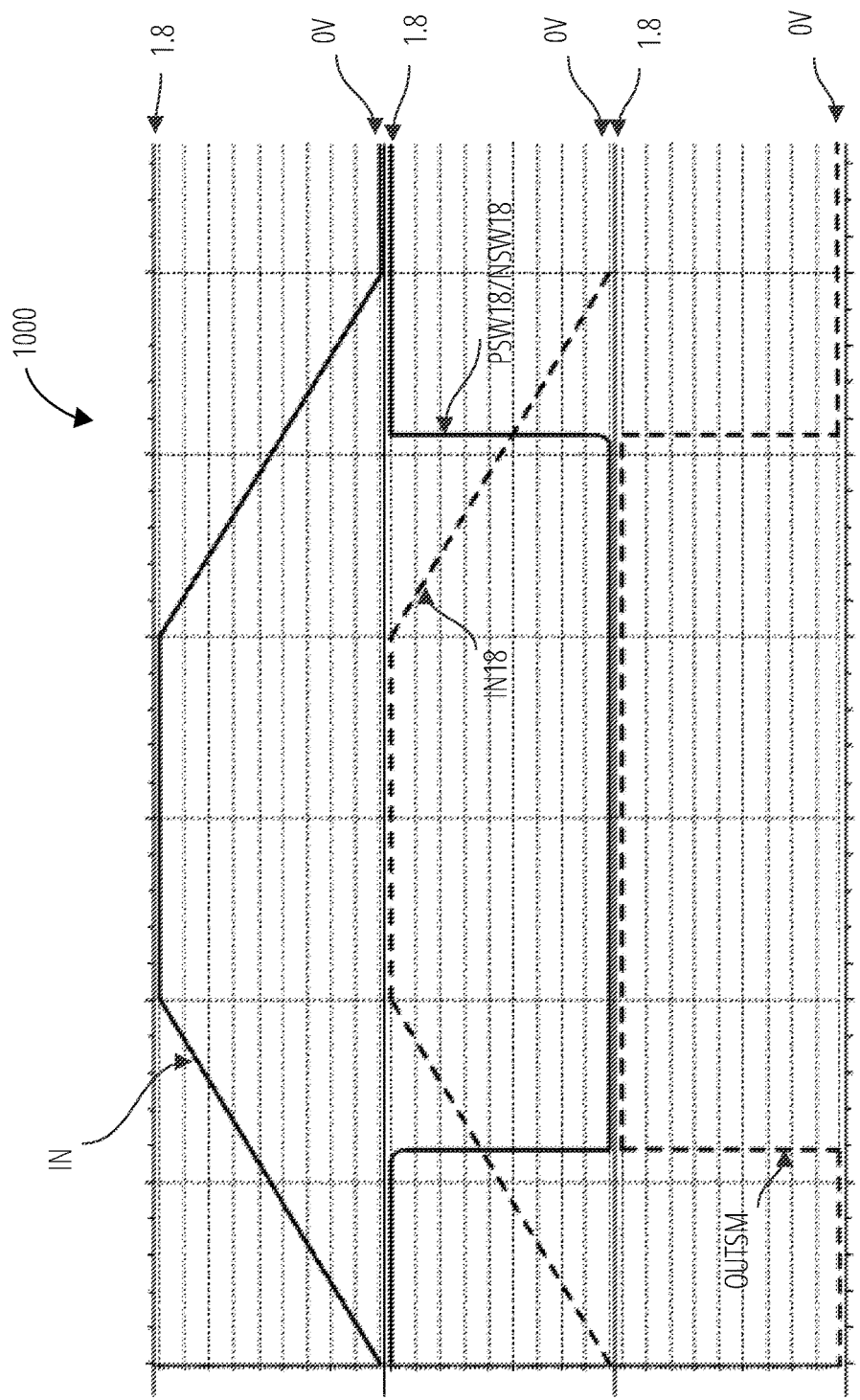
FIG. 10 illustrates a signaling 1000 in accordance with one embodiment.

FIG. 7 illustrates signaling 700 for processing high range inputs in one embodiment. For example the signaling 700 may be generate for input signal terminal (IN) signals having a range of 0V-3.3V, where LV=0, VDD33=3.3V, VN=2.0V, and VP=1.3V. The noise margin 702 is shown as well as the intervals during which "0" is retained by MN6 704 and "1" is retained by MN6 706. FIG. 8 depicts some of the same signals depicted in FIG. 7 in more detail for an exemplary 0.0V-3.3V IN signal at the input signal terminal of the receiver. Note that IN has a voltage range of 3.3V but the internal signals INH, PSW33, INL, and NSW33 are limited to a voltage range of 2.0V. FIG. 9 depicts signaling 900 for processing low range inputs in one embodiment. For example the signaling 900 may be generated for input signal terminal signals having a range of 0V-1.8V, where LV=1, VDD33=1.8V, VN=1.8V, and VP=0V. The noise margin 902 is also illustrated. FIG. 10 depicts some of the same signals depicted in FIG. 9 in more detail for an exemplary 0.0V-1.8V IN signal at the input signal terminal of the receiver. The voltage range of the internal signals IN18, PSW18, and NSW18 are limited to 1.8V.

Within this disclosure, different entities (which may variously be referred to as "units", "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:
1. A circuit comprising:
an input signal terminal coupled to a first data path and a second data path;
the first data path configured to propagate a low range of a plurality of signals received at the input signal terminal;
the second data path configured to propagate a high range of the plurality of signals received at the input signal terminal, the high range having a first voltage range; and
the second data path configured to split the high range of the plurality of signals into an upper range and a lower range each having a voltage range less than the first voltage range;
wherein a plurality of reference bias voltages selectively control propagation of the signals from the input signal terminal through one of the first data path and the second data path, the plurality of reference bias voltages generated based on a voltage level of the plurality of signals received at the input signal terminal.

2. The circuit of claim 1, the first data path comprising:
a dynamic pass circuit;
a voltage regulator; and
the dynamic pass circuit and the voltage regulator each operating from a first reference bias voltage of the plurality of reference bias voltages.

3. The circuit of claim 2, the first data path further comprising:
a digitizer operating from the first reference bias voltage.

4. The circuit of claim 3, the first data path further comprising:
an output stage operating from the first reference bias voltage and a second reference bias voltage of the plurality of reference bias voltages.

5. The circuit of claim 1, the second data path comprising:
an upper range pass circuit controlled by a first reference bias voltage of the plurality of reference bias voltages; and
a lower range pass circuit controlled by a second reference bias voltage of the plurality of reference bias voltages.

6. The circuit of claim 5, the second data path further comprising:
an upper range noise filter coupled to receive an output of the upper range pass circuit; and
a lower range noise filter coupled to receive an output of the lower range pass circuit.

7. The circuit of claim 1, wherein the first data path and the second data path are constructed with components exclusively having a same oxide thickness.

8. The circuit of claim 1, further comprising a digitizer controlled by outputs of the first data path and the second data path.

9. The circuit of claim 8, further comprising a logic retention circuit coupled to an output of the digitizer.

10. The circuit of claim 9, the logic retention circuit controlled by the plurality of reference bias voltages.

11. A signal receiver circuit comprising:
an input signal terminal coupled to apply an input signal to a pair of cross-coupled PMOS transistors;
the input signal terminal further coupled to apply the input signal to a pair of cross-coupled NMOS transistors in parallel with the pair of cross-coupled PMOS transistors;
the input signal terminal configured to apply the input signal to a gate terminal of a first PMOS transistor of the pair of cross-coupled PMOS transistors and to apply the input signal to a gate terminal of a first NMOS transistor of the pair of cross-coupled NMOS transistors; and a gate terminal of a second NMOS transistor of the pair of cross-coupled NMOS transistors is configured to receive an output of a first bias voltage generator, and a gate terminal of a second PMOS transistor of the pair of cross-coupled PMOS transistors configured to receive an output of a second bias voltage generator.

12. The circuit of claim 11, wherein the first bias voltage generator comprises a bandgap scaling circuit.

13. The circuit of claim 11, wherein the second bias voltage generator comprises a circuit configured to generate a difference between a maximum configured voltage level and a first reference voltage generated by the first bias voltage generator.

14. The circuit of claim 11, further comprising a drain terminal of the second NMOS transistor coupled to receive the input signal from the input signal terminal.

15. The circuit of claim 11, further comprising a source terminal of the first NMOS transistor coupled to receive the output of the first bias voltage generator.

16. The circuit of claim 11, further comprising:
the input signal terminal coupled to a third NMOS transistor in parallel with a third PMOS transistor;
a gate of the third NMOS transistor coupled to receive the output of the first bias voltage generator; and
a gate of the third PMOS transistor coupled to receive the input signal.

17. A method comprising:
applying a plurality of signals from an input signal terminal of a circuit in parallel to a first data path and a second data path of the circuit;
activating the first data path to propagate the plurality of signals when the plurality of signals are within a first voltage range;
activating the second data path to propagate the plurality of signals, and deactivating the first data path, when the plurality of signals are within a second voltage range higher than the first voltage range; and
controlling the propagation of the signals through one of the first data path and the second data path using two reference bias voltages generated based on a maximum voltage level of the plurality of signals received at the input signal terminal.

18. The method of claim 17,
splitting signals on the second data path into an upper range and a lower range each having a voltage range less than the first voltage range.

19. The method of claim 18, further comprising:
splitting the signals on the second data path into equal voltage ranges.

20. The method of claim 18, further comprising:
applying independent noise filters to signals in the upper range and to signals in the lower range.

* * * * *